(12) United States Patent
Tung et al.

(10) Patent No.: US 6,179,664 B1
(45) Date of Patent: Jan. 30, 2001

(54) 64PCI-ISA ADD-ON CARD WITH A CARD EDGE CONNECTOR THAT CAN PLUG INTO BOTH 64PCI-ISA AND 32PCI-ISA SLOTS

(75) Inventors: Huei-Guo Tung, Hsin-Chuang; Chun-Chun Liu, Kao-Hsiung, both of (TW)

(73) Assignee: Nexcom International Co. Ltd., Taipei Hsien (TW)

( * ) Notice: Under 35 U.S.C. 154(b), the term of this patent shall be extended for 0 days.

(21) Appl. No.: 09/506,388

(22) Filed: Feb. 18, 2000

(51) Int. Cl.[7] .................................................. H01R 23/70
(52) U.S. Cl. .............................. 439/633; 439/951
(58) Field of Search ...................... 439/633, 60, 59, 439/951, 680, 629–637, 659–662

(56) References Cited

U.S. PATENT DOCUMENTS 3,614,714 * 10/1971 Silverstein .......................... 439/633
5,277,591 * 1/1994 Felcman et al. .......................... 439/60
5,387,132 * 2/1995 Saver et al. ............................ 439/633
5,769,668 * 6/1998 Tondreault ............................ 439/633

* cited by examiner

*Primary Examiner*—Khiem Nguyen
*Assistant Examiner*—J. F. Duverne
(74) *Attorney, Agent, or Firm*—Winston Hsu

(57) ABSTRACT

A 64PCI-ISA edge connector has a standard ISA edge connector and a 64-bit PCI edge connector. The 64-bit PCI edge connector has a 32-bit PCI edge connector and a 64-bit edge connector extension. A gap between the 32-bit PCI edge connector and the 64-bit edge connector extension is made large enough to permit the entire 64PCI-ISA edge connector to plug into a 32PCI-ISA slot, providing 32-bit PCI-ISA functionality in a 32PCI-ISA slot, and 64-bit functionality in a 64PCI-ISA slot.

3 Claims, 3 Drawing Sheets

64PCI-ISA ADD-ON CARD WITH A CARD EDGE CONNECTOR THAT CAN PLUG INTO BOTH 64PCI-ISA AND 32PCI-ISA SLOTS

BACKGROUND OF THE INVENTION

1. Field of the Invention

The present invention relates to a 64-bit PCI-ISA edge connector (64PCI-ISA). More particularly, the present invention describes a 64PCI-ISA edge connector that can plug into a 32-bit PCI-ISA (32PCI-ISA) slot.

2. Description of the Prior Art

The increasing complexity of processors has necessitated a corresponding increase in bus complexity. Such progress can be noted by the various bus standards in use today, such as ISA, 32-bit PCI and, most recently, 64-bit PCI. These standards have their corresponding edge connectors and slots.

Please refer to FIG. 1. FIG. 1 depicts an industry standard 64PCI-ISA edge connector 10 and its associated slot 20. The slot 20 is part of a passive backplane, a device which has only connectors mounted on its surface with a minimal amount of associated circuitry. Backplanes are common in industrial applications as they permit the rapid replacement of entire motherboards, as well as peripheral expansion boards, the backplane itself having a very low likelihood of failure.

The edge connector 10 has two distinct bus lines: an ISA bus edge connector 12 and a 64-bit PCI bus edge connector 14. The 64-bit PCI edge connector 14 has a 32-bit PCI edge connector 16 and a 64-bit PCI edge connector extension 18. The 32-bit PCI edge connector 16 provides full 32-bit PCI bus connectivity. The 32-bit PCI edge connector 16 with the 64-bit PCI edge connector extension 18 together provide full 64-bit PCI bus connectivity. A gap 30 with a predetermined width separates the 32-bit PCI edge connector 16 from the 64-bit PCI edge connector extension 18. Please note that the number of contacts shown in the edge connector 10 are for illustrative purposes only. The actual number of contacts may differ. The full specification for the number of contacts, and their function, is publicly available, for example, from the PCI Special Interest Group, or the PCI Industrial Computer Manufacturers Group.

The slot 20 comprises two distinct bus slots set a predetermined distance apart from each other: an ISA bus slot 22 and a 64-bit PCI bus slot 24. The 64-bit PCI bus slot 24 has a small separator in it (not shown) that corresponds to the gap 30. Each of the slots 22, 24 are actually a little bit longer than the lengths of their corresponding edge connectors, as indicated by the dashed lines 32. This excess length is required for the structural integrity of the slots 22, 24, and is a source of trouble when attempting to plug the 64PCI-ISA edge connector 10 into a 32PCI-ISA slot.

Please refer to FIG. 2. FIG. 2 depicts the 64PCI-ISA edge connector 10 adjacent to a 32PCI-ISA slot 40. The 32PCI-ISA 40 slot comprises two bus slots: an ISA bus slot 42, and a 32-bit PCI bus slot 44. These bus slots are set a predetermined distance apart, a distance equal to that between the two slots of the 64PCI-ISA slot 20. Consequently, the ISA edge connector 12, and the 32-bit PCI edge connector 16, should be able to plug into their corresponding slots 42 and 44, respectively. However, the 32-bit PCI slot 44 is a little too long, as indicated by the dotted lines 34. The extra material required at the ends of the 32-bit PCI slot 44 exceeds the width of the gap 30, and comes into contact with the 64-bit PCI edge connector extension 18. This makes it impossible to plug the edge connector 10 into the slot 40.

The 64PCI-ISA bus is relatively new. Many older systems are not equipped with such slots. Consequently, a manufacturer of computer boards must either make two versions of the board (a 32PCI-ISA version and a 64PCI-ISA version), or suffer a loss of customer base. Making two version of the same board is expensive, inefficient and may be confusing for the customer. Losing potential customers is often simply unacceptable.

SUMMARY OF THE INVENTION

It is therefore a primary objective of this invention to provide a 64PCI-ISA card edge connector that can plug into both a 64PCI-ISA slot and a 32PCI-ISA slot.

The present invention, briefly summarized, calls for an edge connector that comprises an ISA edge connector, a 32-bit PCI edge connector, and a 64-bit PCI edge connector extension. A gap exists between the 64-bit PCI edge connector extension and the 32-bit PCI edge connector. The width of this gap is made sufficiently large so that the 32-bit PCI edge connector can plug into the 32-bit PCI bus slot of a 32PCI-ISA slot.

By enabling a single 64PCI-ISA card, with its associated edge connector, to plug into both a 64PCI-ISA slot and a 32PCI-ISA slot, the present invention ensures the most complete customer base possible for the computer board manufacturer. As a single edge connector of the present invention will fit both types of slots, only a single version of the board must be made, which reduces overhead and simplifies purchasing choices for the customer.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
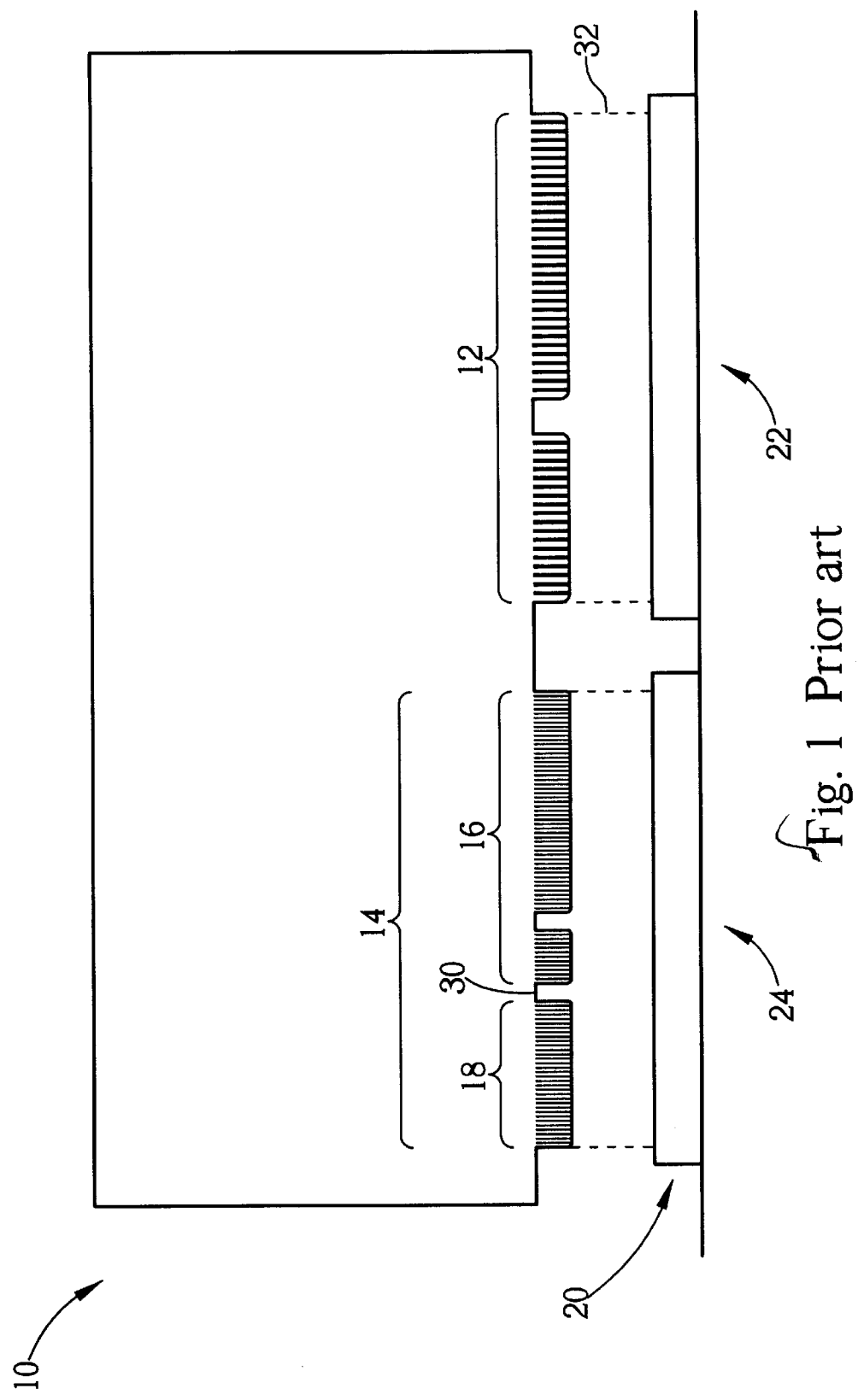
FIG. 1 is a side view of a prior art 64PCI-ISA edge connector and an associated 64PCI-ISA slot.
Figure 2:
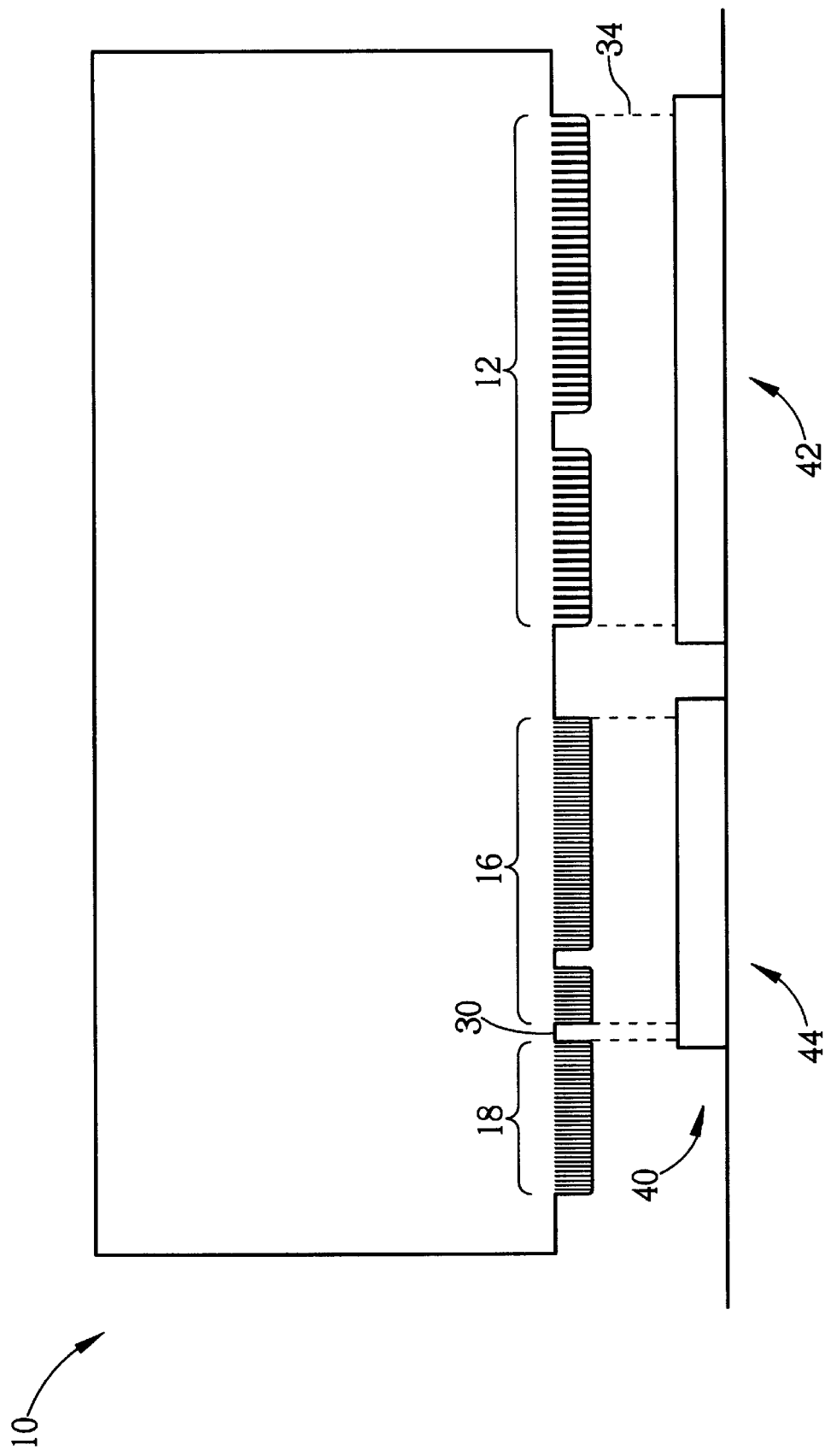
FIG. 2 is a side view of a prior art 64PCI-ISA edge connector and a 32PCI-ISA slot.
Figure 3:
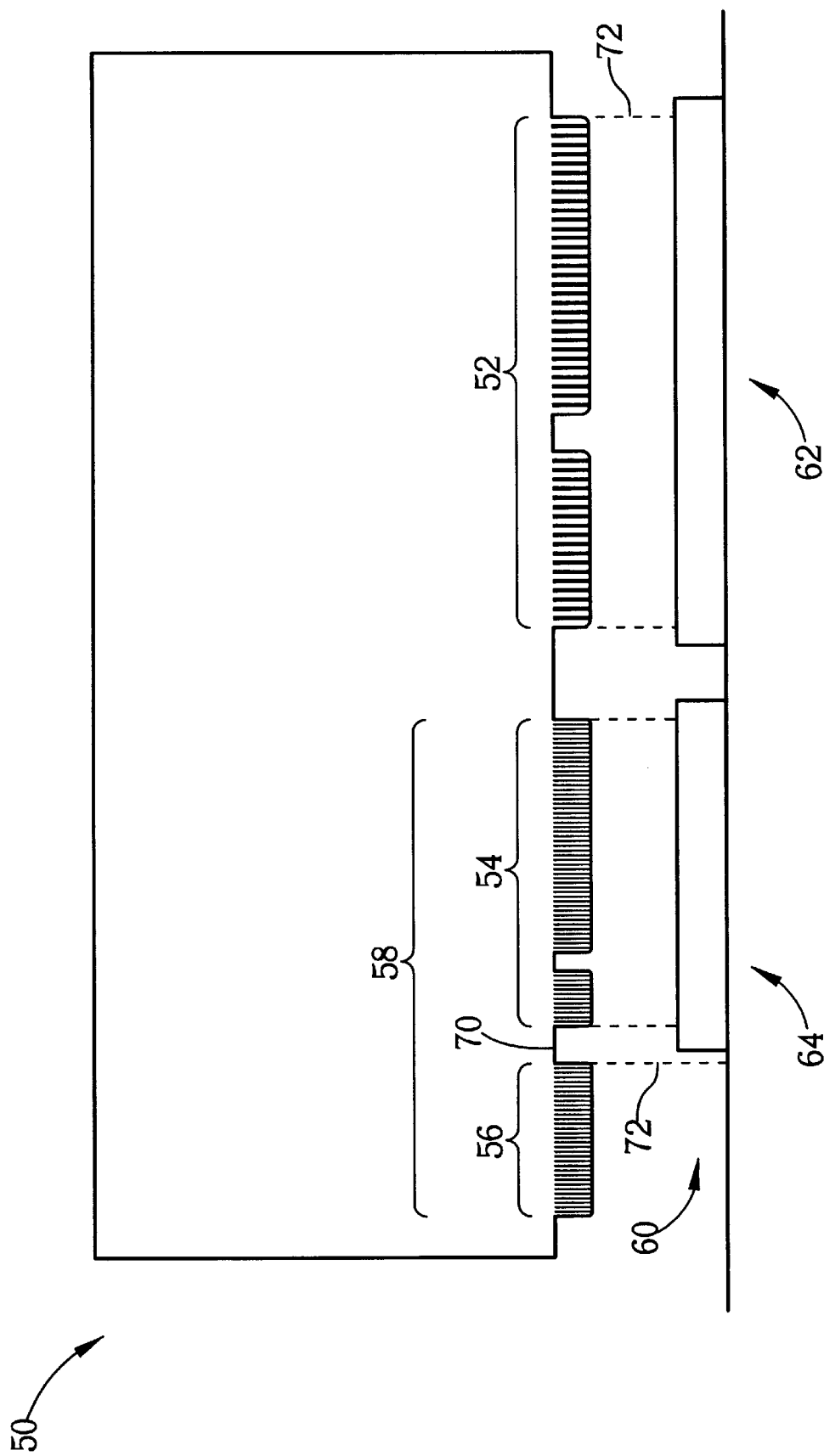
FIG. 3 is a side view of a present invention 64PCI-ISA edge connector and a 32PCI-ISA slot.

Please refer to FIG. 3. FIG. 3 shows a present invention 64PCI-ISA edge connector 50 adjacent to a 32PCI-ISA slot 60. The present invention 64PCI-ISA edge connector 50 comprises two bus edge connectors: an ISA edge connector 52, and a 64-bit PCI edge connector 58. These two distinct edge connectors are separated from each other by a predefined distance, a first gap. The 64-bit PCI edge connector 58 comprises a 32-bit PCI edge connector 54, and a 64-bit PCI edge connector extension 56. A second gap 70 separates the 32-bit PCI edge connector 54 from the 64-bit PCI edge connector extension 56.

The 64PCI-ISA edge connector 50 plugs into a standard 32PCI-ISA slot 60. The 32PCI-ISA slot 60 is identical to that described in the prior art, comprising an ISA bus slot 62 and a 32-bit PCI bus slot 64.

As shown by the dotted lines 72, the width of the second gap 70 is made just large enough to prevent the 64-bit PCI edge connector extension 56 from contacting the 32-bit PCI slot 64. Consequently, both the ISA edge connector 52 and the 32-bit PCI edge connector 54 can plug into their respective slots 62 and 64. The 64-bit PCI edge extension 56 simply overhangs the 32-bit PCI slot, making no electrical contact.

The second gap 70 should have a width greater than 2.25 mm (millimeters). The preferred width of the second gap 70 is 3.14 mm. If the width is made too narrow, the 64-bit PCI edge extension 56 will contact the edge of the 32-bit PCI slot 64, and the edge connectors 52 and 54 will not be able to seat properly into their respective slots. If the width is made too great, an excessive number of contacts will be lost on the 64-bit PCI edge extension 56.

As shown in FIG. 3, the edge connector 50 comprises a plurality of contacts. As in the prior art, the contacts depicted are merely for illustrative purposes and should not be taken literally. The edge connector 50 has two faces, and each face has its own plurality of contacts. Because of the extra width of the second gap 70, the 64-bit PCI edge extension 56 of the present invention lacks a single contact on each side of its face that would be found on an industry-standard 64PCI-ISA edge contact. One of the contacts is ground. The other has been reserved for future use. Neither of these, then, is of critical importance. Consequently, the 32-bit PCI edge connector 54, in combination with the 64-bit PCI edge extension 56, together provide 64-bit PCI functionality. Hence, the edge connector 50 can plug into both a 32PCI-ISA slot to provide 32-bit PCI-ISA functionality, and it can also plug into a 64PCI-ISA slot to provide 64-bit PCI-ISA functionality.

In contrast to the prior art, the present invention has a slightly larger gap between the 32-bit PCI edge connector and the 64-bit PCI edge extension. This wider slot permits the present invention edge connector to plug into both a 64PCI-ISA slot and a 32PCI-ISA slot, and maintain functionality for both.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A 64PCI-ISA add-on card with a card edge connector at a bottom side of the 64PCI-ISA add-on card that can plug into a 64PCI-ISA slot or a 32PCI-ISA slot of a printed circuit board, the 32PCI-ISA slot comprising an ISA socket and a 32-bit PCI socket positioned next to the ISA socket, the 64PCI-ISA slot comprising an ISA socket and a 64-bit PCI socket positioned next to the ISA socket, the 64PCI-ISA card edge connector comprising:

an ISA edge connector;

a 32-bit PCI edge connector positioned next to the ISA edge connector, a first gap existed between the 32-bit PCI edge connector and the ISA edge connector for separating the 32-bit PCI edge connector from the ISA edge connector; and a 64-bit PCI edge connector extension positioned next to the 32-bit PCI edge connector, the 64-bit PCI edge connector extension substantially providing 64-bit PCI capabilities in conjunction with the 32-bit PCI edge connector, a second gap existing between the 64-bit PCI edge connector extension and the 32-bit PCI edge connector for separating the 64-bit PCI edge connector extension from the 32-bit PCI edge connector;

wherein when the 64PCI-ISA card edge connector is plugged into the 64PCI-ISA slot, the ISA edge connector, the 32-bit PCI edge connector and the 64-bit PCI edge connector extension of the 64PCI-ISA card edge connector plug into their respective sockets of the 64PCI-ISA slot at the same time, and when the 64PCI-ISA card edge connector is connected to the 32PCI-ISA slot, the width of the second gap is sufficiently large to permit the ISA edge connector and the 32-bit PCI edge connector of the 64PCI-ISA card edge connector to plug into the ISA socket and the 32-bit PCI socket of the 32PCI-ISA slot.

2. The 64PCI-ISA card edge connector of claim 1 wherein the width of the second gap is greater than 2.25 mm (millimeters).

3. The 64PCI-ISA card edge connector of claim 1 wherein the second gap is generated by removing at least a ground contact and a reserved contact of the 64-bit PCI edge connector extension that are next to the 32-bit PCI edge connector.

\* \* \* \* \*